United States Patent [19]
Huang

[11] Patent Number: 6,127,260
[45] Date of Patent: Oct. 3, 2000

[54] METHOD OF FORMING A TEE SHAPED TUNGSTEN PLUG STRUCTURE TO AVOID HIGH ASPECT RATIO CONTACT HOLES IN EMBEDDED DRAM DEVICES

[75] Inventor: Jenn Ming Huang, Hsin-Chu, Taiwan

[73] Assignee: Taiwan Semiconductor Manufacturing Company, Hsin-Chu, Taiwan

[21] Appl. No.: 09/354,672

[22] Filed: Jul. 16, 1999

[51] Int. Cl.[7] .................. H01L 21/4763; H01L 21/8242
[52] U.S. Cl. .......................... 438/629; 438/253; 438/672
[58] Field of Search .................. 438/629, 672, 438/675, 253–256, 296–299, 381, 238

[56] References Cited

U.S. PATENT DOCUMENTS

| | | | |
|---|---|---|---|
| 5,485,035 | 1/1996 | Lin et al. | 257/637 |
| 5,552,343 | 9/1996 | Hsu | 437/195 |
| 5,741,741 | 4/1998 | Tseng | 438/637 |
| 5,821,141 | 10/1998 | Huang | 438/253 |
| 5,869,403 | 2/1999 | Becker et al. | 438/738 |
| 5,877,092 | 3/1999 | Lee et al. | 438/738 |
| 5,918,120 | 6/1999 | Hung | 438/239 |
| 6,051,462 | 6/1999 | Ohno | 438/241 |

*Primary Examiner*—Jey Tsai
*Attorney, Agent, or Firm*—George O. Saile; Stephen B. Ackerman

[57] ABSTRACT

A process for forming a narrow diameter opening, in thick insulator layers, has been developed. The process allows the aspect ratio for a narrow diameter opening, to be reduced, by utilizing a two stage opening procedure. A first stage is used to create a first narrow diameter opening, in composite insulator layers, via an anisotropic RIE procedure. An isotropic wet etch procedure is then employed to widen the first narrow diameter opening, only in an overlying, doped silicon oxide component of the composite insulator layers, while the openings in the underlying, undoped silicon oxide components, of the composite insulator layers, do not increase in diameter. This tee shaped opening is used to accommodate a tee shaped metal structure, featuring a wide metal shape, located in the widened opening in the doped silicon oxide component, of the composite insulator layers. A second narrow diameter opening is then formed in an overlying, planarized insulator layer, exposing a portion of the top surface of the wide metal shape, of the tee shaped metal structure. Formation of an upper metal plug, in the second narrow diameter opening, concludes the process for forming a metal structure, in a narrow diameter opening, where the aspect ratio of the narrow diameter opening was reduced via a two stage opening procedure.

21 Claims, 10 Drawing Sheets

METHOD OF FORMING A TEE SHAPED TUNGSTEN PLUG STRUCTURE TO AVOID HIGH ASPECT RATIO CONTACT HOLES IN EMBEDDED DRAM DEVICES

BACKGROUND OF THE INVENTION (1) Field of the Invention

The present invention relates to methods used to fabricate semiconductor devices, and more specifically to a method used to reduce a high aspect ratio, for contact holes formed in thick insulator layers.

(2) Description of Prior Art

The use of dynamic random access memory, (DRAM), cells, embedded in a semiconductor chip that is also comprised with peripheral, or non-DRAM, logic devices, has resulted in combinations of thick insulator layers, overlying the peripheral, logic devices. The combination of thick insulator layers, needed to passivate specific DRAM features such as crown shaped capacitor structures, as well as bit line structures, result in difficulties when opening contact holes to active device regions of the peripheral logic devices. The combination of a narrow diameter contact hole, in the thick insulator layers, result in a high aspect ratio contact hole, approaching about 15 to 1, thus presenting difficulties when anisotropically forming the contact holes, as well as presenting difficulties filling the high aspect ratio openings.

This invention will describe a process sequence that allows a narrow diameter contact hole, to be formed in thick insulator layers, without encountering high aspect ratio phenomena. This is accomplished by forming a tee shaped opening, in a lower level of insulator layers, comprised of a wider diameter opening in a top portion of the lower level of insulator layers, and with a narrower diameter opening, formed in the bottom portion of the lower level of insulator layers. When filled with a conductive material, a tee shaped, conductive plug structure is formed, featuring a wider conductive feature, in the wider diameter opening, of the top portion of the lower level insulator layers, overlying the narrower conductive feature, located in the narrow diameter opening, in the lower portion of the lower level of insulator layers. The tee shaped contact hole opening, is accomplished via a dry etch—wet etch procedure, applied to a composite insulator layer, comprised of undoped, and doped, insulator layers. Additional insulator deposition, is followed by the opening of an overlying, second narrow diameter opening, exposing a portion of the top surface of the tee shaped, conductive plug structure. Subsequent metal deposition and patterning is then used to create a conductive plug, in a narrow diameter contact hole, landed on the underlying, wider conductive plug section, of the underlying tee shaped conductive plug structure. The use of this two stage opening, thus reduces the aspect ratio, while the wide metal shape, located in the first narrow diameter opening, allows easier alignment of the second narrow diameter opening to be realized.

Prior art such as Becker et al, in U.S. Pat. No. 5,869,403, describes an opening in a composite insulator layer, comprised of an overlying, thick, doped oxide layer, and an underlying, thin undoped oxide layer, with an undercut in the thin undoped oxide layer. However that prior art features an opening in a composite insulator layer, with the undercut region, located in a thin doped oxide layer. The focus of this present invention, however, not observed in any prior art, is the use of the undercut region, in a contact hole, to allow formation of a tee shaped conductive structure, in a lower contact hole, then overlaid with an upper, narrower conductive plug, located in an upper contact hole, with the upper, narrower conductive plug, landing on the wider, tee shaped region, of the lower conductive plug structure.

SUMMARY OF THE INVENTION

It is an object of this invention to reduce the aspect ratio of narrow diameter contact holes, formed in thick insulator layers.

It is another object of this invention to form a first narrow diameter contact hole, in a lower level of insulator layers, featuring a wide diameter opening, in a top portion of the first narrow diameter contact hole, with the first narrow diameter contact hole then filled with a tee shaped, metal plug structure, comprised with a wide metal shape, located in the wide diameter portion, in the first narrow diameter contact hole.

It is still another feature of this invention to form the first narrow diameter contact hole, or first narrow diameter opening, in a composite insulator layer, comprised of an overlying, thin undoped insulator layer, a doped insulator layer, and an underlying, thick insulator layer, via use of an anisotropic RIE procedure, followed by a wet etch procedure, used to create an undercut region in the doped insulator layer, resulting in the desired wide diameter portion, of the first narrow diameter contact hole, or first narrow diameter opening.

It is still yet another object of this invention to form a second narrow diameter opening, in an upper level, insulator layer, directly overlying the first narrow diameter contact hole, with the second narrow diameter opening then filled with an upper level metal plug structure, which overlays, and contacts, the wide metal shape, located in the wide diameter portion, of the first narrow diameter opening.

In accordance with the present invention a method of creating a metal plug structure, in a narrow diameter contact hole, or narrow diameter opening, in thick insulator layers, in which the aspect ratio of the contact hole is reduced via a two stage opening procedure, and featuring the use of a tee shaped, lower metal plug structure, located in a first narrow diameter contact hole, allowing an upper metal plug structure, located in a second narrow diameter opening, to be easily land on the underlying tee shape metal feature, is described. After formation of a first set of transfer gate transistors in a first region, of the semiconductor substrate, used for DRAM devices, and formation of a second set of transfer gate transistors, used for peripheral, non-DRAM devices a bit line structure is formed in the DRAM device region, overlying, and contacting, a first polysilicon plug structure, located between silicon nitride encapsulated gate structures, that in turn contacts a first source/drain region, of a transfer gate transistor. A crown shaped capacitor structure is next formed, connected to a second polysilicon plug structure, in the DRAM device region, by a polysilicon storage node contact plug, which in turn contacts a second source/drain region. A composite insulator layer is next deposited, comprised of an overlying undoped silicon oxide layer, a thin, doped silicon oxide layer, and a thick, undoped silicon oxide layer. An anisotropic RIE procedure is used to open a first narrow diameter contact hole, in the composite insulator layer, and in underlying insulator layers, exposing a third source/drain region, located in the peripheral, non-DRAM region, of the semiconductor substrate. A wet etch procedure is then employed to widen the first narrow diameter contact hole, in the doped oxide region. A tee shaped, lower metal plug structure is formed in the first narrow diameter contact hole, featuring a wide metal shape, located in the undercut, doped oxide layer. An overlying insulator layer is next deposited, and planarized, followed by the formation of a second narrow diameter opening, exposing a portion of the top surface of the wide metal shape, of the tee shaped, metal plug structure. An upper metal plug structure is then formed in the second narrow diameter opening, overlying, and contacting, the tee shaped, lower metal structure, located in the first narrow diameter contact hole.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of fabricating a metal plug structure, in a narrow diameter contact hole, comprised of an upper level metal plug structure, in a top portion of the narrow diameter contact hole, overlying, and contacting a tee shaped, lower level metal plug structure, in a bottom portion of the narrow diameter contact hole, will now be described in detail. A P type, semiconductor substrate 1, is used and schematically shown in FIG. 1. Region 80, of semiconductor substrate 1, will be used to accommodate DRAM cells, while region 70, will be used for peripheral, or non-DRAM devices. Isolation regions 2, comprised of either insulator filled, shallow trench regions, or thermally grown, field oxide, (FOX), regions, are formed to separate DRAM device region 80, from peripheral device region 70, as well as to separate specific transfer gate transistors, in peripheral device region 70. Transfer gate transistors for DRAM device region, are comprised of polycide gate structures 8, on silicon dioxide gate insulator layer 3, as well as comprised with lightly doped source/drain regions 10. Silicon dioxide gate insulator layer 3, is thermally grown at a thickness between about 60 to 100 Angstroms. Polycide gate structures 8, are formed via deposition of a doped polysilicon layer, at a thickness between about 500 to 1500 Angstroms, followed by the deposition of a metal silicide layer 5, such as tungsten silicide, at a thickness between about 500 to 1500 Angstroms. After deposition of a silicon oxide layer 6, at a thickness between about 100 to 300 Angstroms, and of a silicon nitride layer 7, at a thickness between about 1000 to 2000 Angstrom, conventional photolithographic, and reactive ion etching, (RIE), procedures, are used to form polycide gate structures 8, in DRAM device region 80, schematically shown in FIG. 1.

Figure 1:
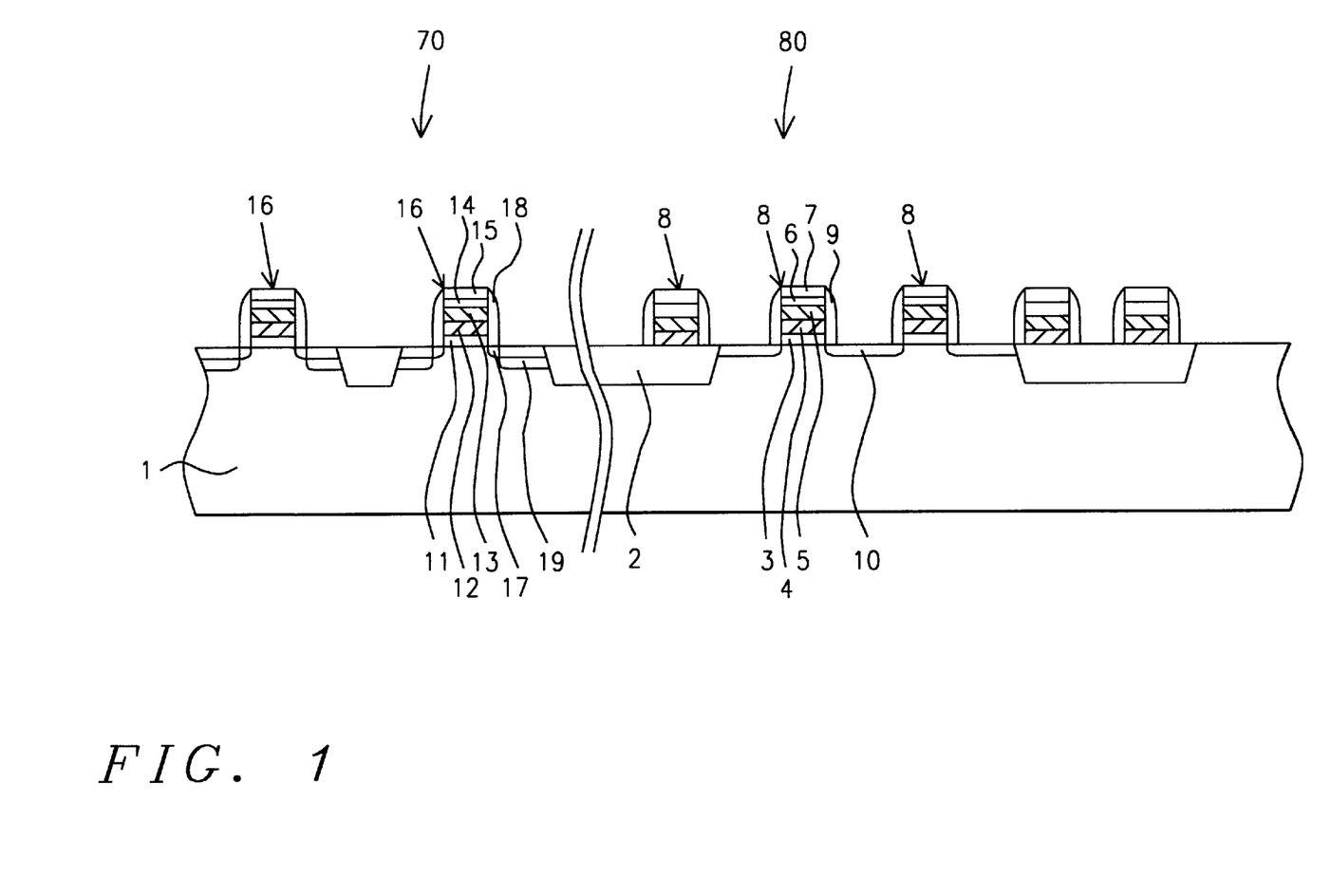
FIGS. 1–10, which schematically in cross sectional style, describe the key stages of fabrication used to create a metal plug structure, in a narrow diameter contact hole, formed in thick insulator layers, and with the metal plug structure comprised of an upper level metal plug, located in an upper portion of the narrow diameter contact hole, overlying, and contacting, a tee shaped, lower level metal plug, located in a lower portion of the narrow diameter contact hole.

Polycide gate structures 16, in peripheral region 70, if desired, can be formed simultaneously with polycide gate structures 8, in DRAM device region 80. Therefore polycide gate structures 16, would overlay silicon dioxide gate insulator layer 11, at the same thickness as silicon dioxide gate insulator layer 3, with silicon nitride layer 15, silicon oxide layer 14, metal silicide layer 13, and doped polysilicon layer 12, identical in thickness to counterpart layers, silicon nitride layer 7, silicon oxide layer 6, metal silicide layer 5, and doped polysilicon layer 4, residing in DRAM device region 80. Lightly doped source/drain regions 10, in DRAM device region 80, and lightly doped source/drain regions 17, in peripheral device region 70, can be formed simultaneously, if desired, via the ion implantation of arsenic or phosphorous ions. In addition insulator spacers 9, on the sides of polycide gate structures 8, in DRAM device region 80, and insulator spacers 18, on the sides of polycide gate structures 16, can also be formed simultaneously, via the deposition of either a silicon nitride, or a silicon oxide layer, at a thickness between about 400 to 2000 Angstroms, followed by an anisotropic RIE procedure, creating the insulator layers. This is schematically shown in FIG. 1. However if desired, for performance reasons, the transfer gate transistors of each region, DRAM region 80, and peripheral region 70, regarding the gate insulator layers, the polycide gate structures, and the source/drain regions, can be formed independently, employing the specific thicknesses, and specific source/drain concentrations, desired for each specific region. However to create heavily doped source/drain region 19, in peripheral device region 70, shown schematically in FIG. 1, a photoresist shape is used to protect DRAM device region 80, from an arsenic, or phosphorous, ion implantation procedure, used to create heavily doped source/drain regions 19, in peripheral device region 70. Although the transfer gate transistors, in both DRAM device region 80, and peripheral device region, have been described as N channel devices, these regions, or portions of these regions, can be fabricated as P channel regions, via the creation of an N well region, in a region of P type semiconductor substrate 1, followed by the formation of P type, source/drain regions.

Figure 2:
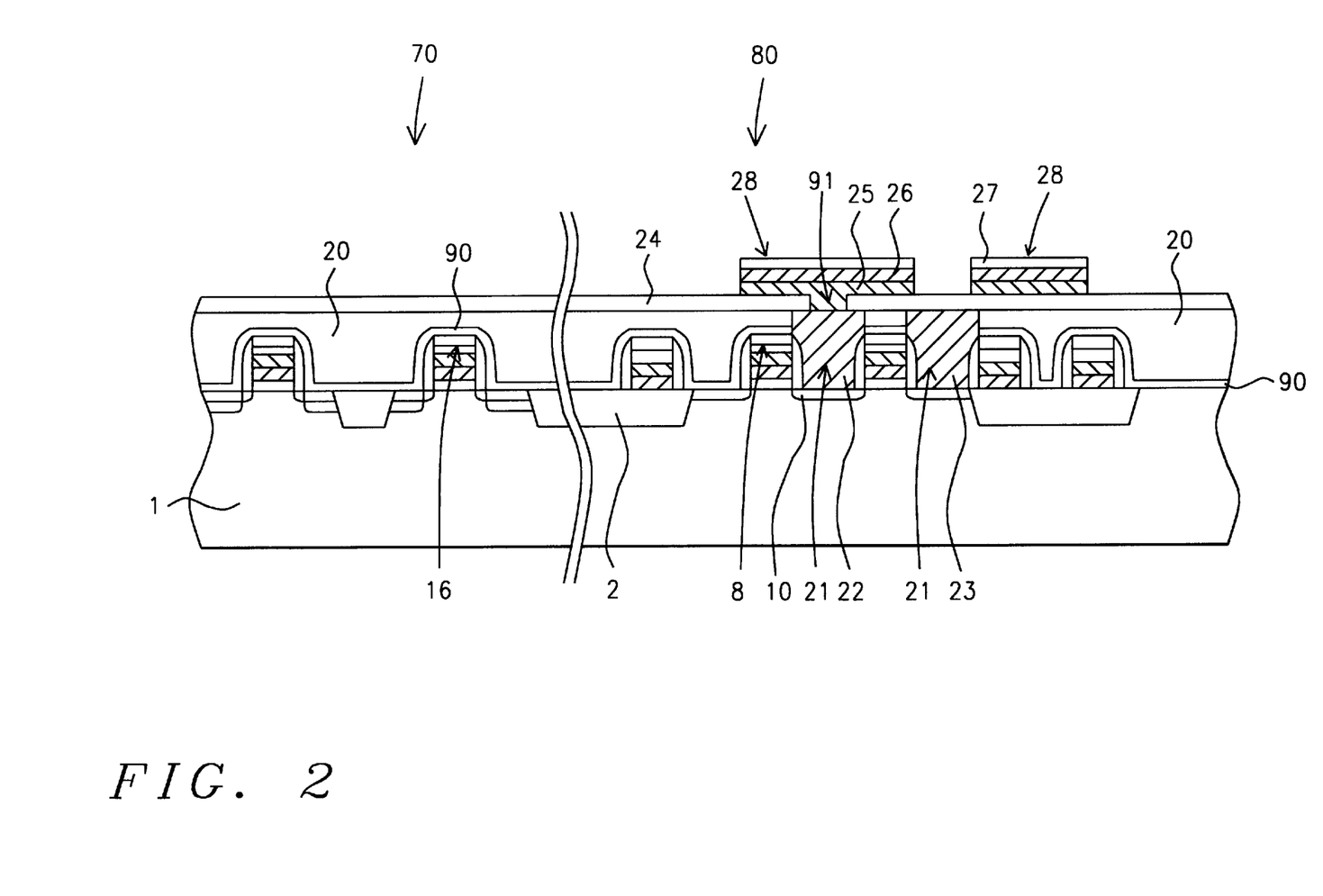

Silicon oxynitride layer 90, is next deposited, via low pressure chemical vapor deposition, (LPCVD), or via plasma enhanced chemical vapor deposition, (PECVD), procedures, at a thickness between about 100 to 500 Angstroms. Insulator layer 20, comprised of either silicon oxide, or borophosphosilicate glass, (BPSG), is next deposited via LPCVD or PECVD procedures, at a thickness between about 5000 to 7000 Angstroms. A chemical mechanical polishing, (CMP), procedure is then used for planarization purposes, resulting in a smooth top surface topography for insulator layer 20. Conventional photolithographic and RIE procedures, using CHF$_3$ as an etchant, are used to create openings 21, in insulator layer 20, and in silicon oxynitride layer 90, exposing lightly doped source/drain regions 10, in DRAM device region 80. This is schematically shown in FIG. 2. After removal of the photoresist shape used for definition of openings 21, via plasma oxygen ashing and careful wet cleans, polysilicon plug structures 22, and 23, are formed in openings 21. This is accomplished via deposition of a doped polysilicon layer, via LPCVD procedures, at a thickness between about 2000 to 4000 Angstroms, followed by a CMP procedure, removing the regions of the doped polysilicon layer residing on the top surface of insulator layer 20. Insulator layer 24, comprised of silicon oxide, is next deposited via LPCVD or PECVD procedures, at a thickness between about 1000 to 2000 Angstroms, followed by the creation of bit line opening 91, using conventional photolithographic and RIE procedures, using CHF$_3$ as an etchant, exposing a portion of the top surface of polysilicon plug structure 21. This is schematically shown in FIG. 2. After removal of the photoresist shape, used for definition of bit line opening 91, via plasma oxygen ashing and careful wet cleans, bit line structure 28, is created via: the deposition of doped polysilicon layer 25, at a thickness between about 300 to 1000 Angstroms, completely filling bit line opening 91; the deposition of tungsten silicide layer 26, at a thickness between about 500 to 1500 Angstroms; and the deposition of silicon nitride layer 27, at a thickness between about 1000 to 2000 Angstroms; followed a patterning procedure, using conventional photolithographic and RIE procedures, using $Cl_2$ as an etchant, resulting in bit line structure 28, schematically shown in FIG. 2. Opening 29, in the center of bit line structure 28, to be used to accommodate a subsequent storage node contact structure, is also opened during the bit line patterning procedure. The photoresist shape sued to define bit line structure 28, is removed via plasma oxygen ashing and careful wet cleans.

Figure 3:
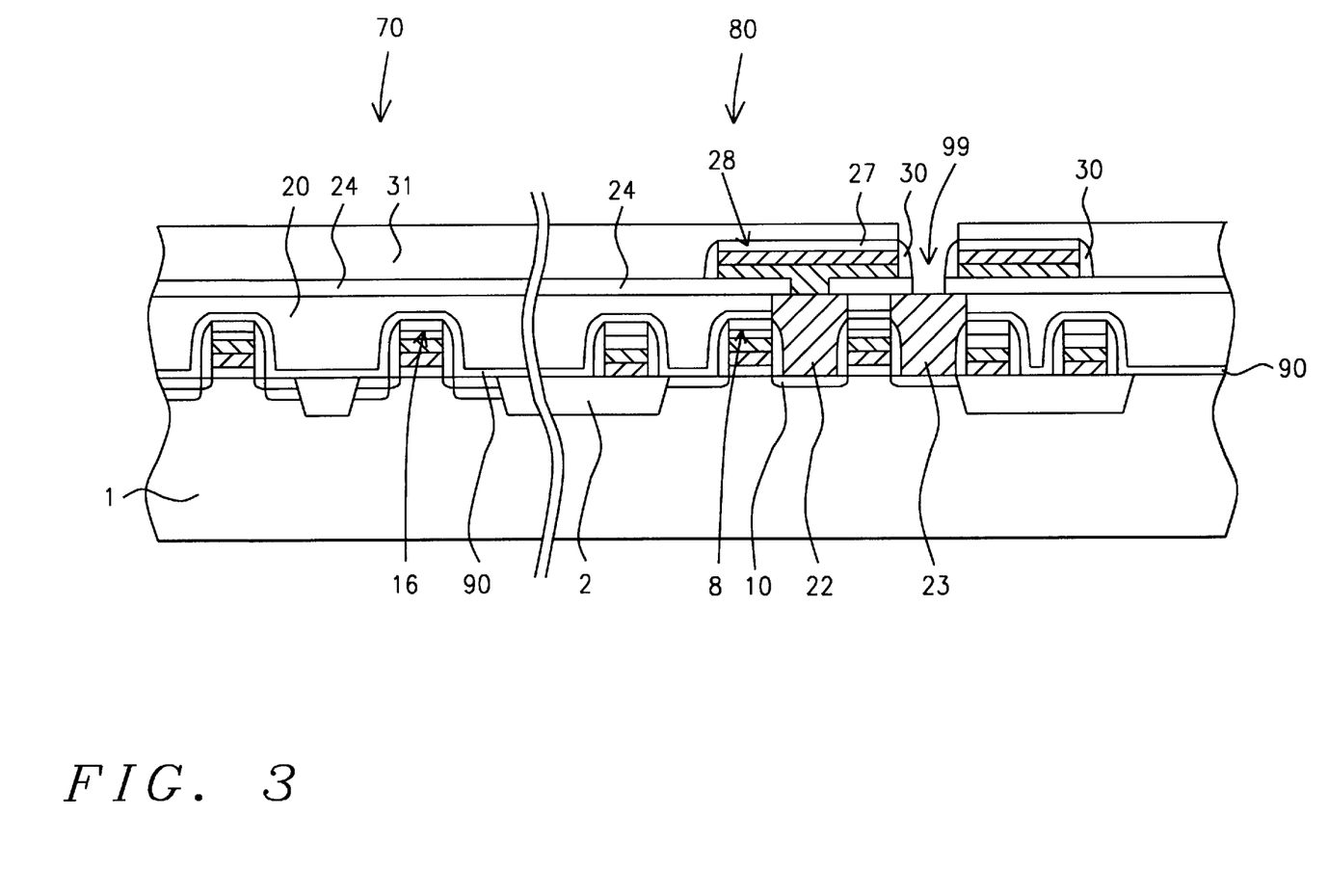

Silicon nitride spacers 30, are next formed on the sides of bit line structure 28, as well as on the sides of opening 29, via deposition of a silicon nitride layer, via LPCVD or PECVD procedures, at a thickness between about 500 to 1500 Angstroms, followed by an anisotropic RIE procedure, using $Cl_2$ as an etchant. This is schematically shown in FIG. 3. Insulator layer 31, comprised of either silicon oxide, or BPSG, obtained via LPCVD or PECVD procedures, is next deposited, at a thickness between about 5000 to 7000 Angstroms, than subjected to a CMP planarization procedure, resulting in a smooth top surface topography for insulator layer 31. Conventional photolithographic and RIE procedures, using $CHF_3$ as an etchant, are used to create storage node opening 99, in insulator layer 31, and in insulator layer 24, with storage node opening 99, self-aligned to bit line structure 28, which in turn is encapsulated by overlying silicon nitride layer 27, and by silicon nitride spacers 30. This is schematically shown in FIG. 3.

Figure 4:
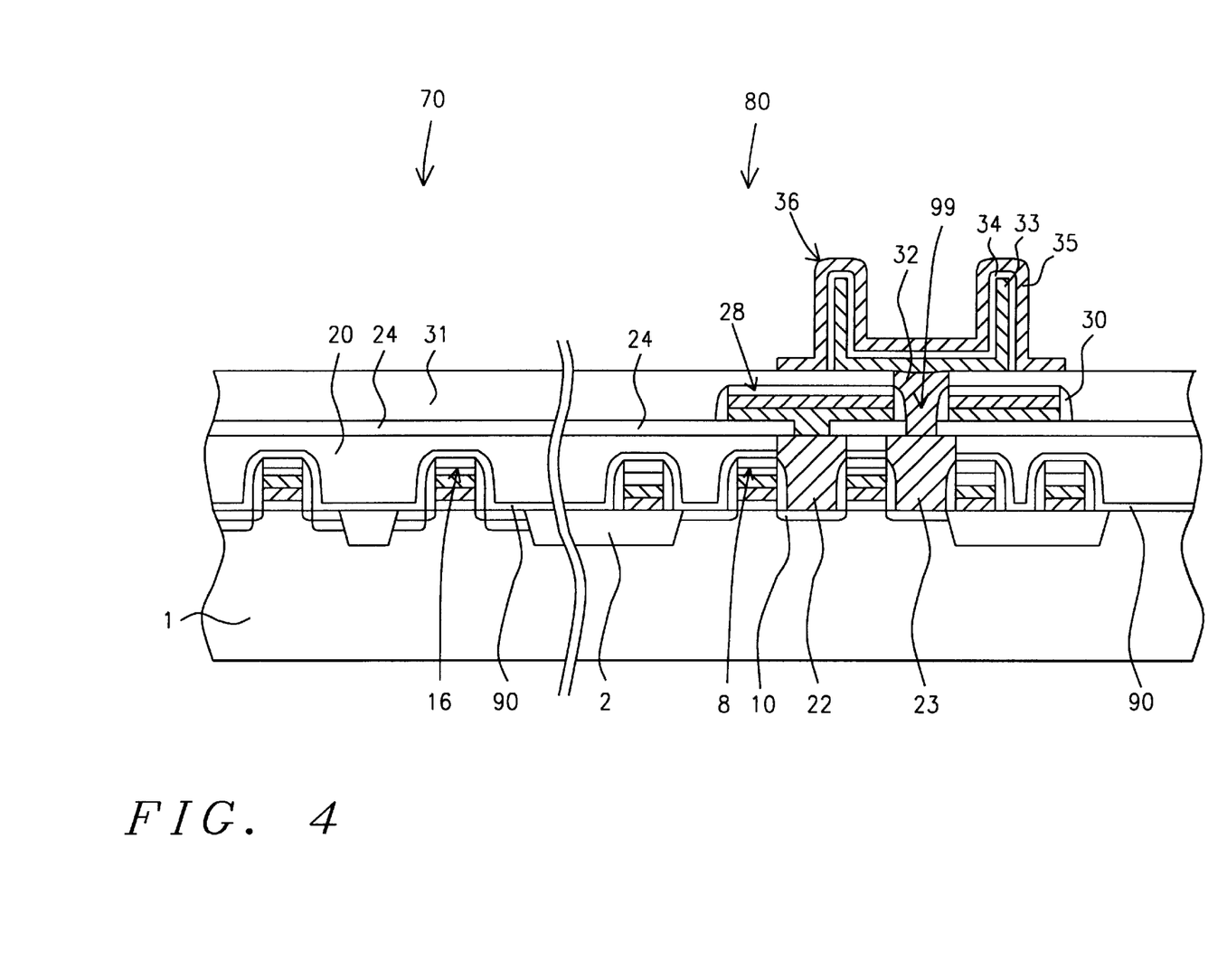

FIG. 4, schematically shows the formation of crown shaped, capacitor structure 36. First a doped polysilicon, storage node contact structure 32, is formed in storage node opening 99, via deposition of an in situ doped polysilicon layer, using LPCVD procedures, completely filling storage node opening 99. Regions of the in situ doped polysilicon layer, residing on the top surface of insulator layer 31, are then removed via a CMP procedure, or via a selective RIE procedure, using $Cl_2$ as an etchant, creating doped polysilicon, storage node contact structure 32. Crown shaped, storage node structure 33, comprised of polysilicon is next formed via: initially creating an opening in a capacitor opening, defining insulator layer, (not shown in the drawings), with the opening exposing the top surface of doped polysilicon, storage node contact structure 32; deposition of a thin polysilicon layer, coating all exposed surfaces of the opening in the capacitor opening, defining insulator layer; removal of the regions of the thin polysilicon layer residing on the top surface of the opening in the capacitor opening defining insulator layer; and than selectively removing the capacitor opening defining insulator layer, resulting in the crown shaped, storage node structure 33, schematically shown in FIG. 4, featuring vertical polysilicon features, connected by a horizontal polysilicon feature, which overlays, and contacts, the top surface of doped polysilicon, storage node contact structure 99. A capacitor dielectric layer 34, such as ONO, (Oxidized Nitride on Oxide), layer, or a NO, (Oxidized Nitride), layer, is formed on crown shaped, storage node structure 33, followed by the formation of polysilicon upper plate structure 35, formed via deposition of, and patterning of, a polysilicon layer.

Figure 5:
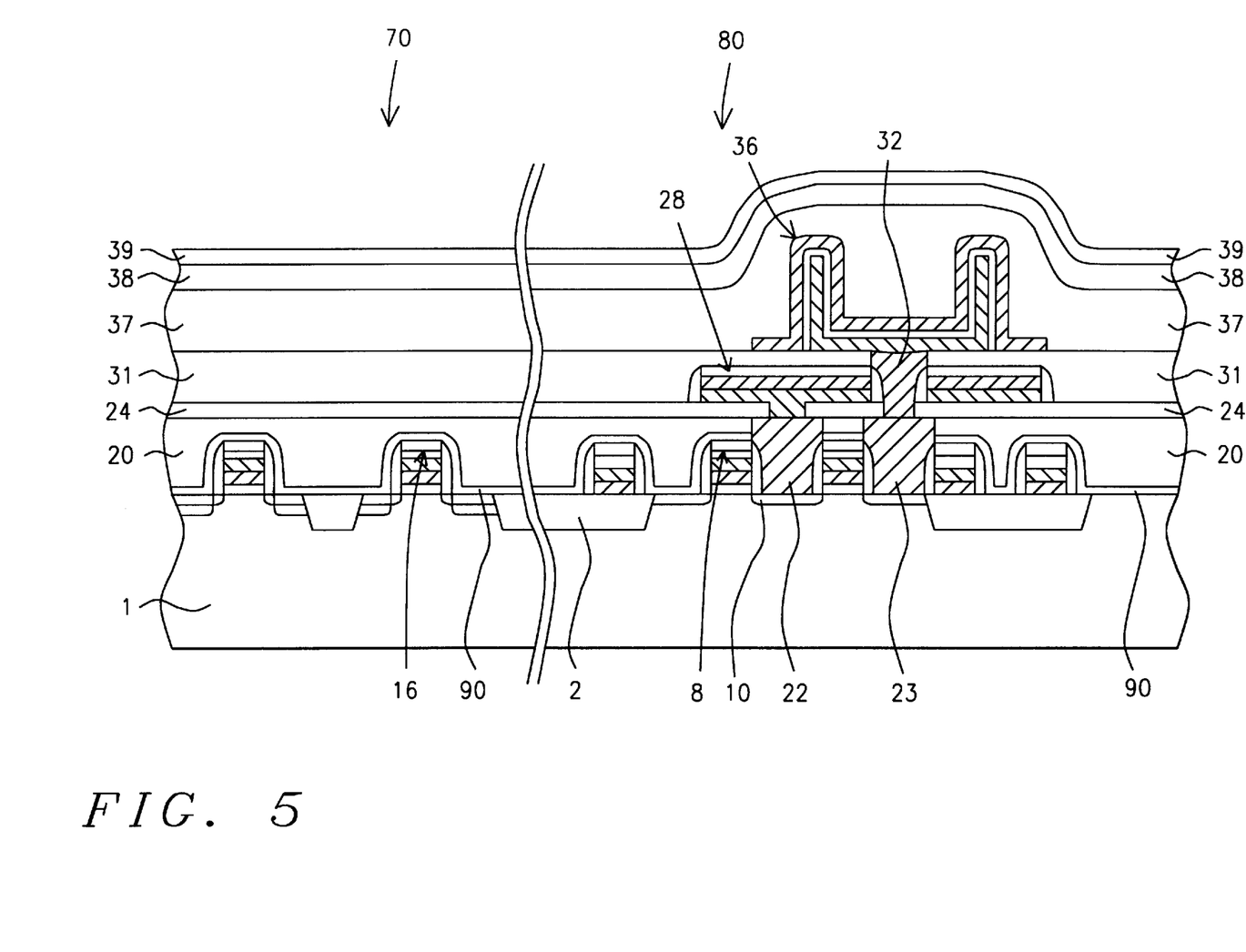
Figure 6:
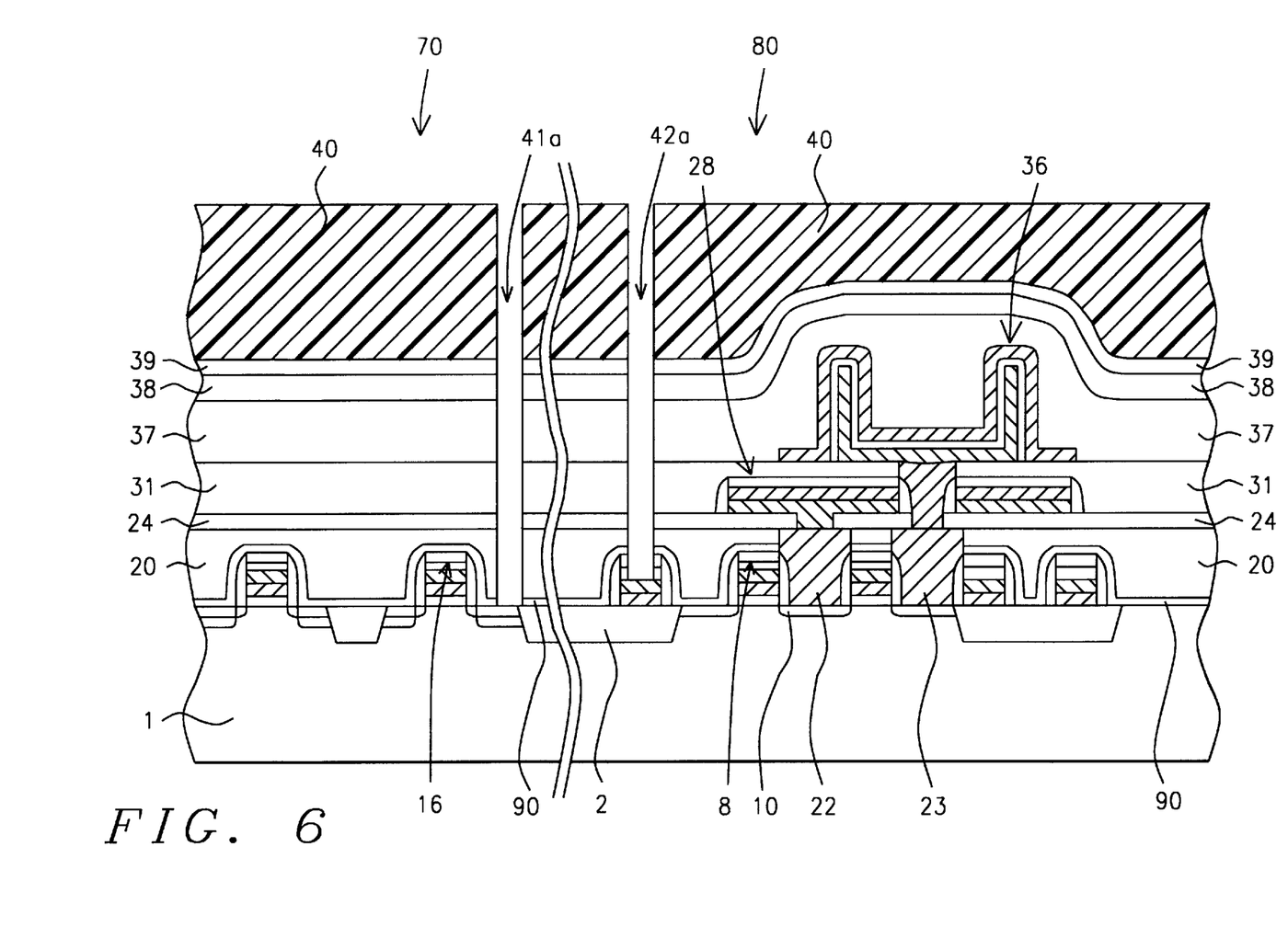
Figure 7:
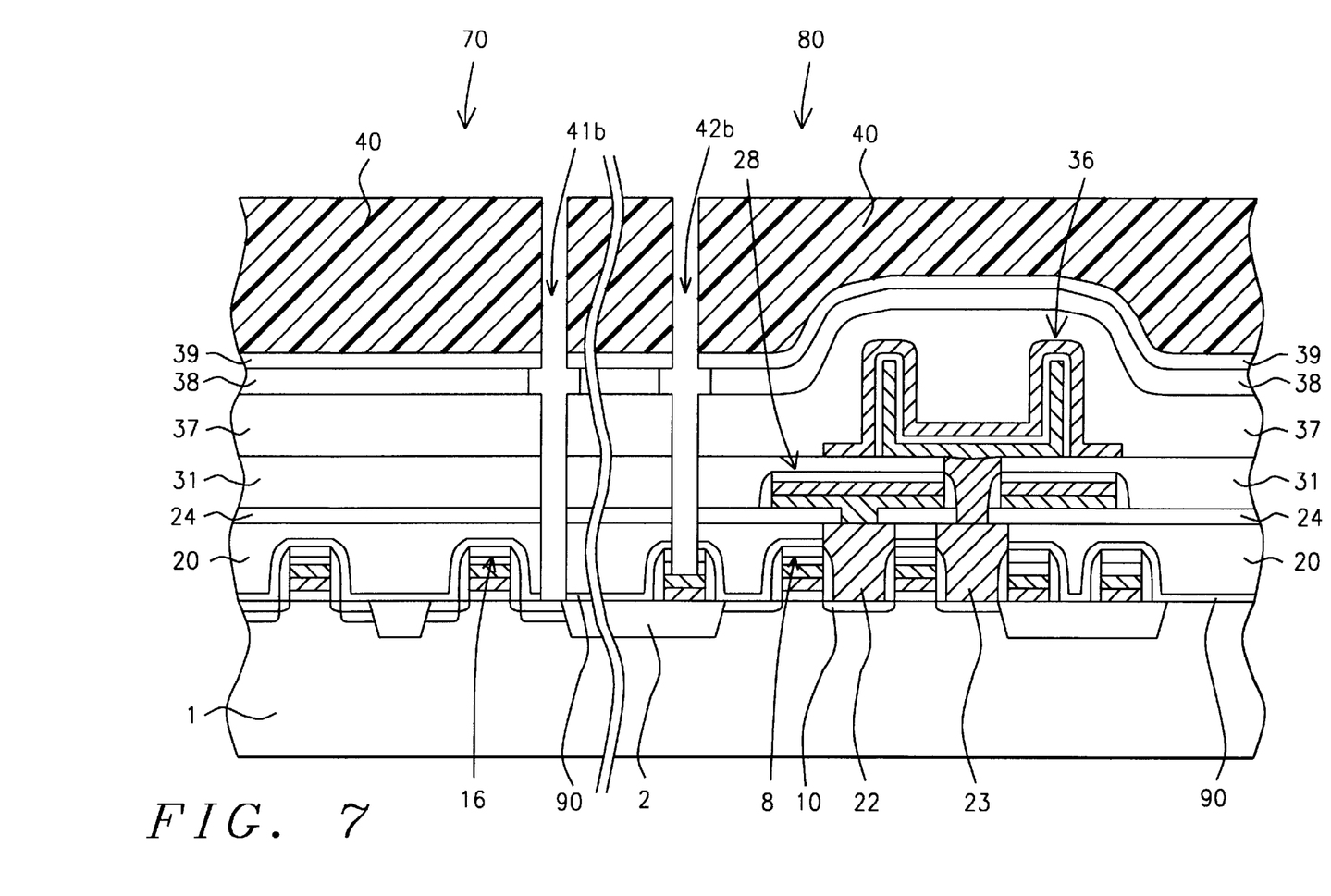

The severe topography created by crown shaped, capacitor structure 36, featuring the vertical polysilicon features, requires thick, overlying insulator layers, for passivation. The needed thick insulators needed, in addition to existing underlying insulator layers 31, 24, and 20, will in turn, present difficulties when attempting to open contact holes to active device regions, or to gate structures, in peripheral device region 70. The combination of a narrow diameter contact hole, in thick insulator layers, will result in aspect ratios of about 14, (with the aspect ratio expressed as the depth of the opening, divided by the diameter of the opening), presenting difficulties in the opening of this high aspect ratio contact hole, as well as presenting difficulties when forming a metal plug structure in the high aspect ratio, contact hole. Therefore a process will now be described in which the narrow diameter contact hole is formed in two stages. FIGS. 5–7, schematically describe the fabrication of a first, narrow diameter opening. First a composite insulator layer, with an underlying component being an underlying thick, undoped silicon oxide layer 37, is deposited via LPCVD or PECVD procedures, at a thickness between about 5000 to 10000 Angstroms. Next a doped silicon oxide layer 38, containing either $P_2O_5$, or $B_2O_3$, each at between about 3 to 5 weight %, is deposited via LPCVD or PECVD procedures, at a thickness between about 500 to 2000 Angstroms. Finally a thin, undoped silicon oxide layer 39, is deposited via LPCVD or PECVD procedures, at a thickness between about 200 to 500 Angstroms. The result of these depositions is schematically shown in FIG. 5.

Photoresist shape 40, is formed and used as a mask to allow an anisotropic RIE procedures, to create first narrow diameter opening 41a: in undoped silicon oxide layer 39, in doped silicon oxide layer 38, in undoped silicon oxide layer 37; in insulator layer 31; in insulator layer 24; and in insulator 20; using $CHF_3$ as an etchant, and then switching to $CH_2F_2/O_2$ as an etchant, for silicon oxynitride layer 90. First narrow diameter opening 41a, with a diameter between about 3000 to 3500 Angstroms, exposes a portion of the top surface of heavily doped source/drain region 19, in peripheral device region 70. The aspect ratio of first narrow diameter opening 41a, is between about 4 to 6, to 1. In addition another first narrow diameter opening 42a, is formed exposing the top surface of metal silicide layer 13, in polycide gate structure 8, in DRAM device region 80. This is again via an anisotropic RIE procedure, using $CHF_3$ as an etchant: for undoped silicon oxide layer 39; for doped silicon oxide layer 38, for undoped silicon oxide layer 37; for insulator layer 31; for insulator layer 24; for insulator layer 20; and for insulator layer 14; while $Cl_2$ is used to define the opening in silicon nitride layer 15. The result of this anisotropic RIE procedure, is schematically shown in FIG. 6.

A key aspect of this invention is now addressed, the use of a wet etch procedure, featuring the use of a buffered hydrofluoric acid solution, or a dilute hydrofluoric acid solution, providing an isotropic etch component to doped silicon oxide layer 38. The lateral etching of doped oxide layer 38, increases the diameter, or width of the first narrow diameter opening, in doped silicon oxide layer 38, to between about 4000 to 5000 Angstroms, resulting in tee shaped, first narrow diameter openings 41b, and 42b, schematically shown in FIG. 7. After the isotropic wet etch procedure, photoresist shape 40, is removed via plasma oxygen ashing and careful wet cleans.

Figure 8:
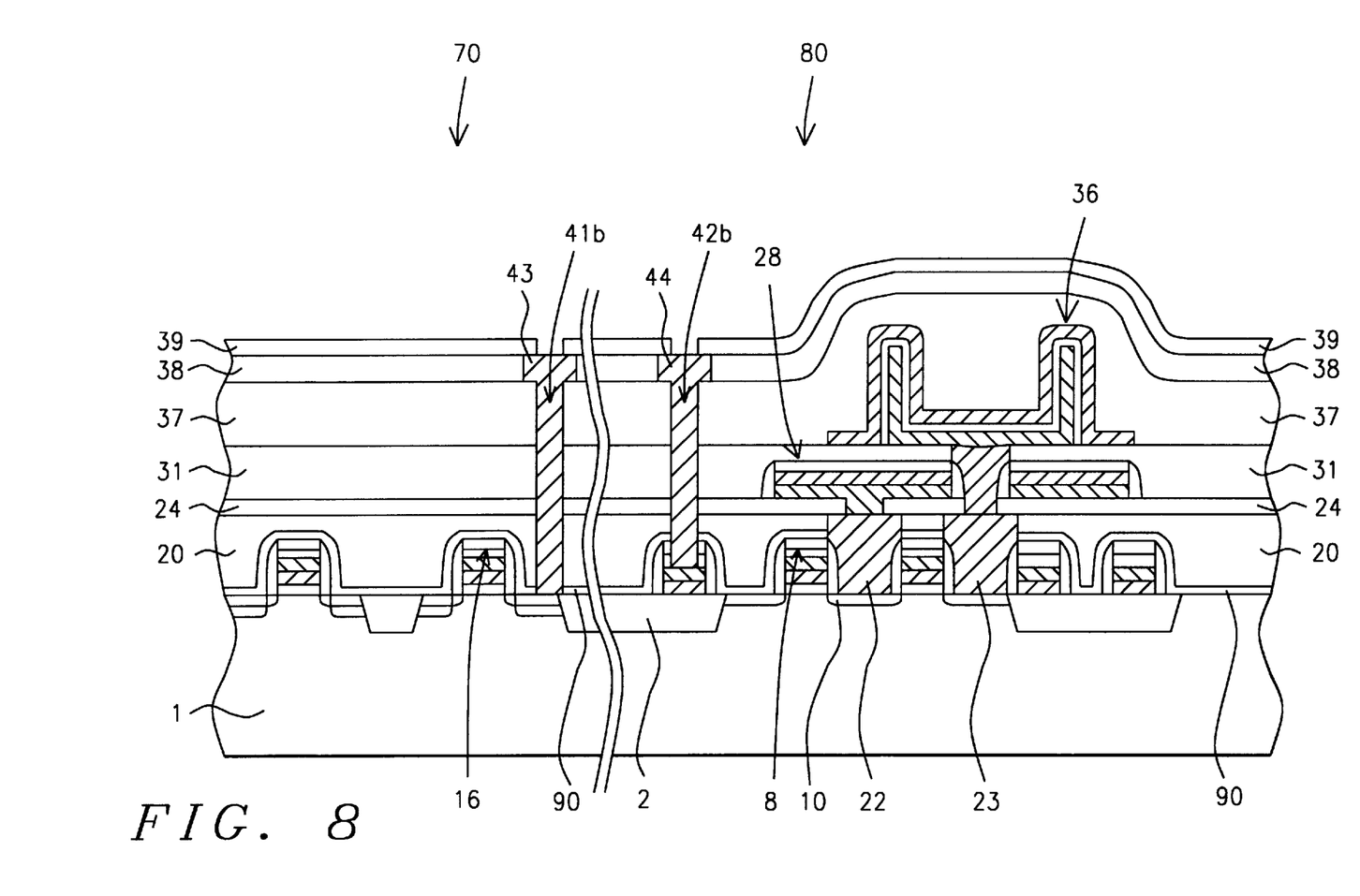

FIG. 8, schematically shows the formation of tee shaped, lower metal plug structures 43, and 44. A composite metal layer, comprised of an underlying titanium layer, used for adhesion purposes, a titanium nitride layer, used as a barrier layer, and an overlying tungsten layer, used for conductivity, is deposited via chemical vapor deposition, or via R.F. sputtering, to a thickness between about 3000 to 4000 Angstroms, completely filling tee shaped, first narrow diameter openings 41b, and 42b. A selective RIE procedure, using $Cl_2$ as an etchant, is used to remove regions of the composite metal layer, from the top surface of undoped silicon oxide layer 39, resulting in tee shaped, lower metal plug structures 43, and 44. At the conclusion of the removal process, and at the appearance of undoped silicon oxide layer 39, an additional removal of the composite metal layer is performed, via a selective RIE procedure, again using $Cl_2$ as an etchant, resulting in the exposure of the wide metal shape, of the tee shaped, lower metal plug structures, in the tee shaped, first narrow diameter openings. A similar result can be achieved using a composite insulator layer, comprised of only doped silicon oxide layer 38, and underlying undoped silicon oxide layer 37. The combination of the anisotropic RIE procedure, and the isotropic wet etch procedure, would result in the desired tee shape, first narrow diameter openings, however without the narrow diameter opening, that would have present if overlying, undoped silicon oxide layer 39, had been used, and thus the wide metal shape, of the tee shaped, lower metal plug structure, would be exposed at the conclusion of the RIE procedure, without the additional metal RIE removal procedure.

Figure 9:
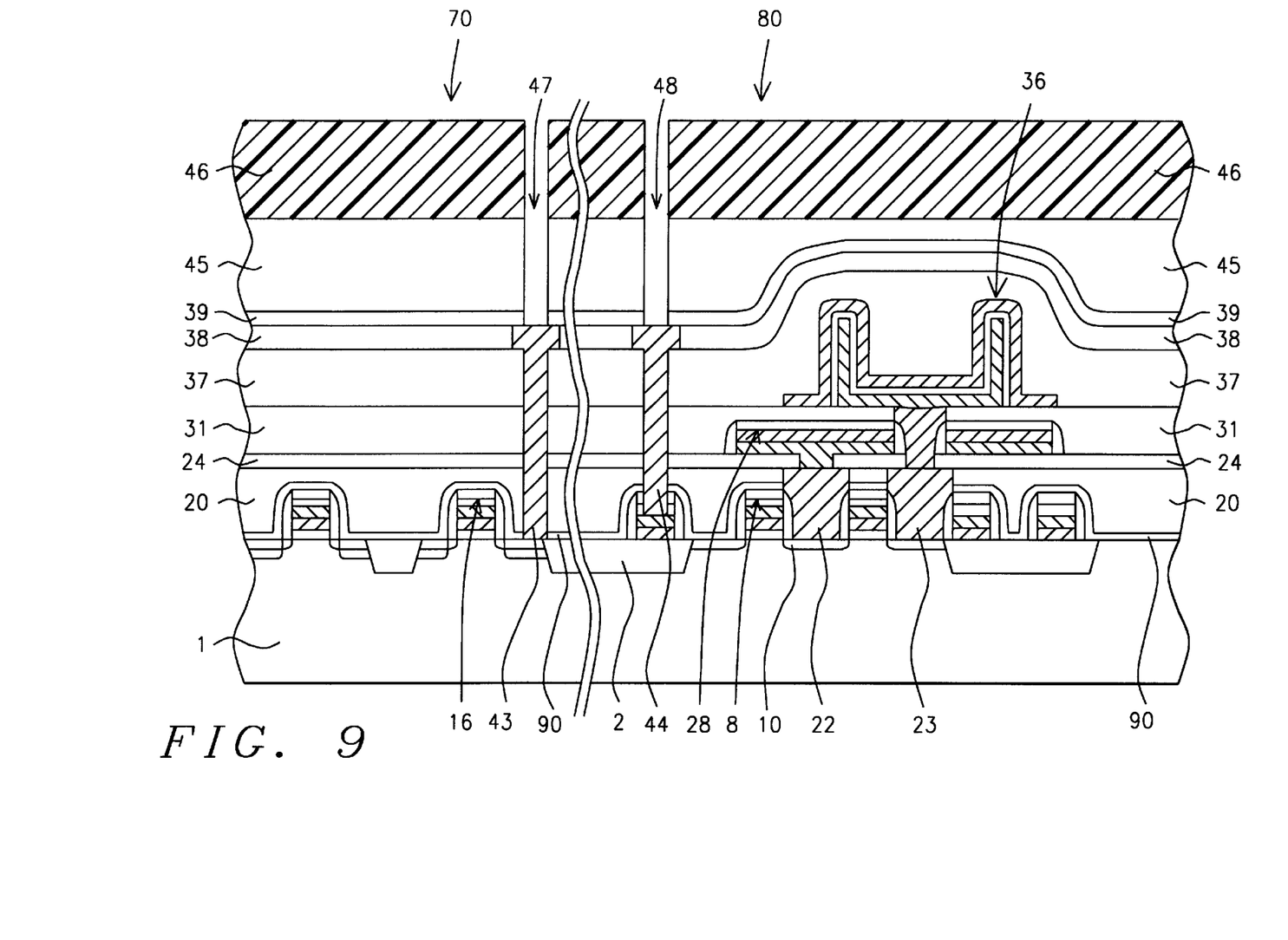

A thick silicon oxide layer 45, is next deposited, via LPCVD or PECVD procedures, at a thickness between about 5000 to 8000 Angstroms. A CMP procedure is then employed for planarization purposed resulting in a smooth top surface topography for silicon oxide layer 45, overlying both peripheral device region 70, and DRAM device region 80. Photoresist shape 46, is next formed on the planar top surface topography of silicon oxide layer 45, and used as a mask to allow second narrow diameter openings 47, and 48, to be formed in silicon oxide layer 45, via an anisotropic RIE procedure, using $CHF_3$ as an etchant. Second, narrow diameter opening 47, and 48, are formed with a diameter between about 2500 to 3000 Angstroms, and with an aspect ratio between about 2 to 4, to 1. The anisotropic RIE procedure, used to create the second narrow diameter openings, exposes the top surface of the wide metal shape of the tee shaped, lower metal plug structures. This is schematically shown in FIG. 9. However even if a mis-alignment occurred between the second narrow diameter opening, and the underlying tee shaped, lower metal plug structure, located in the first narrow diameter openings, the anisotropic RE procedure would continue to etch the portion of undoped silicon oxide layer 39, exposed in the mis-alignment, ultimately exposing a portion of the top surface of the wide metal shape, of the tee shaped, lower metal plug structure. In addition if the option of not using undoped silicon oxide layer 39, is chosen, mis-alignment of second, narrow diameter openings 47, and 48, may still expose a portion of the wide metal shape, of the tee shaped, lower metal plug structure, without the additional RIE procedure needed for the undoped silicon oxide layer 39.

Figure 10:
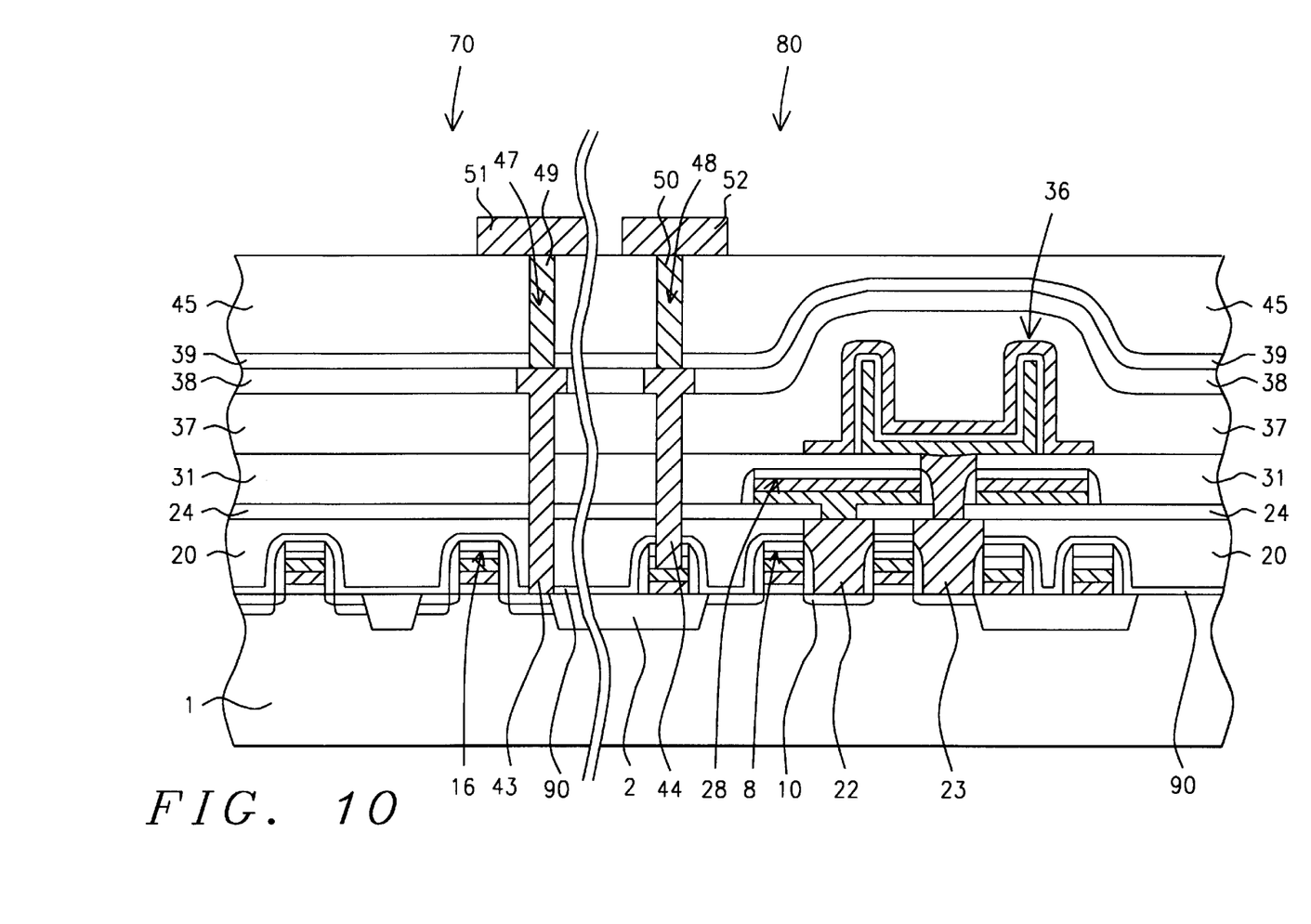

After removal of photoresist shape 46, via plasma oxygen ashing and careful wet cleans, a tungsten layer is deposited, via LPCVD or R.F. sputtering procedures, at a thickness between about 3000 to 4000 Angstroms, completely filling second narrow diameter openings 47, and 48. Removal of tungsten, in regions overlying silicon oxide layer 45, is accomplished via a CMP procedure, or a selective RIE procedure, using $Cl_2$ as an etchant, resulting in upper metal plug structures 49, and 50, in second narrow diameter openings 47, and 48 respectfully. Upper metal plug structures 49, and 50, overlay and contact a portion, of the top surface of the wide metal shape, of the tee shaped, lower metal plug structures. This is schematically shown in FIG. 10. Without the use of the two stage contact hole opening, the aspect ratio of a narrow diameter contact hole, in the total thickness of insulator, would be about 14 to 1, while the aspect ratio for each stage of the narrow diameter contact hole opening is only between about 4 to 6, to 1. In addition the use of a doped oxide component, allows a tee shape metal structure to be formed as part of a lower metal structure, in turn allowing a more forgiving overlay, of the second narrow diameter opening, to the underlying first narrow diameter opening, to be accommodated. Interconnect metal structures 51, and 52, comprised of an aluminum based metal, or of tungsten, are shown overlaying, and contacting the top surface of the upper metal plug structures. The interconnect metal structures are formed using conventional metal deposition, and conventional patterning procedures.

While this invention has been particularly shown and described with reference to the preferred embodiments thereof, it will be understood by those skilled in the art that various changes in form and detail may be made without departing from the spirit or scope of the invention.

What is claimed is:

1. A method of fabricating a metal plug structure in an opening in insulator layers, on a semiconductor substrate, comprising the steps of:

providing a first group of transfer gate transistors, in a first region of said semiconductor substrate, to be used for a peripheral device region, and providing a second set of transfer gate transistors, in a second region of said semiconductor substrate to be used for a dynamic random access memory, (DRAM), region;

providing a bit line structure, and an overlying crown shaped, capacitor structure, in in said DRAM device regions, and with said first group of insulator layers, underlying, and overlying said bit line structure, and said crown shaped capacitor structure, in said DRAM device region, and with said first group of insulator layers overlying said first group of transfer gate transistors, in said peripheral device region;

depositing a composite insulator layer, comprised with an overlying undoped insulator layer, a doped insulator layer, and an underlying undoped oxide layer, on said first group of insulator layers in said peripheral device region, and on said crown shaped capacitor structure, and said first group of insulator layers, in said DRAM device region;

forming a first opening in composite insulator layer, and in said first group of insulator layers, exposing a portion of the top surface of a source/drain region of a transfer gate transistor, in said peripheral region;

performing a wet etch procedure, to increase the diameter of the opening, in said doped insulator layer, of said composite insulator layer;

forming a tee shaped, lower metal plug structure, in said first opening, with a wide metal shape, located in the opening in said doped insulator layer;

forming a planarized insulator layer, on the top surface of said tee shaped, lower metal plug structure, and on the top surface of said composite insulator layer, forming a second opening in said planarized insulator layer, exposing a portion of the top surface of said wide metal shape; and forming an upper metal plug structure, in said second opening, overlying and contacting, said tee shaped, lower metal plug structure.

2. The method of claim 1, wherein said first group of insulator layers is comprised of: an underlying silicon oxynitride layer, at a thickness between about 100 to 500 Angstroms; a silicon oxide, or borophosphosilicate, (BPSG), layer, at a thickness between about 5000 to 7000 Angstroms; a silicon oxide layer, at a thickness between about 1000 to 2000 Angstroms; and an overlying silicon oxide, or BPSG layer, at a thickness between about 5000 to 7000 Angstroms.

3. The method of claim 1, wherein said composite insulator layer is comprised of: an underlying, undoped silicon oxide layer, at a thickness between about 5000 to 10000 Angstroms; a doped silicon oxide layer, at a thickness between about 500 to 2000 Angstroms, containing between about 3 to 5 weight percent of either $P_2O_5$, or $B_2O_3$, and an overlying, undoped silicon oxide layer, at a thickness between about 200 to 500 Angstroms.

4. The method of claim 1, wherein said composite insulator layer is comprised of an underlying, undoped silicon oxide layer, at a thickness between about 5000 to 10000 Angstroms, and an overlying, doped silicon oxide layer, at a thickness between about 500 to 2000 Angstroms, doped with either $B_2O_3$, or $P_2O_5$, at a weight percent between about 3 to 5.

5. The method of claim 1, wherein said first opening, is formed in said composite insulator layer, and in said first group of insulator layers, via an anisotropic RE procedure, using $CHF_3$ as an etchant for all layers, except for the silicon oxynitride component of said first group of insulator layer, where $CH_2F_2/O_2$ is used as the etchant.

6. The method of claim 1, wherein the diameter of said first opening, after the anisotropic RIE procedure, is between about 3000 to 3500 Angstroms, with an aspect ratio between about 4 to 6, to 1.

7. The method of claim 1, wherein said diameter of the opening in said doped silicon oxide layer, is widened to between about 4000 to 5000 Angstroms, in diameter, via use of a buffered hydrofluoric acids, or a dilute hydrofluoric acid solution.

8. The method of claim 1, wherein said tee shaped, lower metal plug structure is comprised of a tungsten, encased in a composite layer comprised of a underlying titanium layer, and an overlying titanium nitride layer.

9. The method of claim 1, wherein said planarized insulator layer is a silicon oxide layer, obtained via LPCVD or PECVD procedures, at a thickness between about 5000 to 8000 Angstroms, then planarized via a chemical mechanical polishing procedure.

10. The method of claim 1, wherein said second opening is formed in said planarized insulator layer, via an anisotropic RIE procedure, using $CHF_3$ as an etchant, with said second opening having a diameter between about 2500 to 3000 Angstroms, and an aspect ratio between about 2 to 4, to 1.

11. The method of claim 1, wherein said upper metal plug structure is comprised of tungsten.

12. A method of fabricating a tee shaped, lower metal plug structure, in a first opening, in a group of insulator layers, on a semiconductor substrate, wherein said first opening is formed via an anisotropic dry etch procedure, followed by a wet etch procedure, used to increase the diameter of the first opening, in a doped silicon oxide component of the group of insulator layers, to accommodate the wide metal shape of the tee shaped, lower metal plug structure, comprising the steps of:

providing a first group of transfer gate transistors, in a first region of said semiconductor substrate, to be used as a peripheral device region, and providing a second group of transfer gate transistors, in a second region of said semiconductor substrate, to be used for a DRAM device region;

forming a silicon oxynitride shape in said peripheral device region;

depositing a first silicon oxide layer;

forming polysilicon plug structures, in said first silicon oxide layer, contacting source/drain regions, of transfer gate transistors in said DRAM device region;

depositing a second silicon oxide layer;

forming a bit line structure on said second silicon oxide layer, in said DRAM device region, with said bit line structure contacting a first polysilicon plug structure, via a bit line contact structure, located in an opening in said second silicon oxide layer;

depositing a third silicon oxide layer;

forming a crown shaped capacitor structure on said third silicon oxide layer, in said DRAM device region, and contacting a second plug structure via a storage node contact plug, located in an opening in said third silicon oxide layer;

depositing a composite insulator layer, comprised of an underlying first undoped silicon oxide layer, a doped silicon oxide layer, and an overlying, second undoped silicon oxide layer;

performing an anisotropic reactive ion etching procedure, to create a first narrow diameter opening, in said composite insulator layer, in said third silicon oxide layer, in said second silicon oxide layer, in said first silicon oxide layer, and in said silicon oxynitride shape, exposing a portion of a source/drain region, of a transfer gate transistor, in said peripheral device region;

performing an isotropic wet etch procedure to increase the diameter of said first narrow diameter opening, in said doped silicon oxide layer;

depositing a tungsten based layer, completely filling said first narrow diameter opening;

removing the regions of said tungsten based layer, from the top surface of said composite insulator layer, creating said tee shaped, lower metal plug structure in said first narrow diameter opening, with a wide tungsten based shape, located in the opening in said doped silicon oxide layer;

depositing an insulator layer;

performing a CMP procedure to create a planarized insulator layer;

forming a second narrow diameter opening, in said planarized insulator layer, exposing a portion of the top surface of said wide tungsten based shape;

depositing a tungsten layer; and removing the regions of said tungsten layer from the top surface of said planarized insulator layer, creating an upper metal plug structure, in said second narrow diameter opening, overlying and contacting, said portion of the top surface of said wide tungsten based shape.

13. The method of claim 12, wherein said silicon oxynitride shape is obtained from a silicon oxynitride layer, obtained via LPCVD or PECVD procedures, at a thickness between about 100 to 500 Angstroms.

14. The method of claim 12, wherein said first silicon oxide layer is obtained via LPCVD or PECVD procedures, at a thickness between about 5000 to 7000 Angstroms.

15. The method of claim 12, wherein said second silicon oxide layer is deposited via LPCVD or PECVD procedures, at a thickness between about 1000 to 2000 Angstroms.

16. The method of claim 12, wherein said third silicon oxide layer is deposited via LPCVD or PECVD procedures, at a thickness between about 5000 to 7000 Angstroms.

17. The method of claim 12, wherein said composite insulator layer is comprised of underlying, said first undoped silicon oxide layer, obtained via LPCVD or PECVD procedures, at a thickness between about 5000 to 7000 Angstroms; said doped silicon oxide layer, obtained via LPCVD or PECVD procedures, at a thickness between about 500 to 2000 Angstroms, containing either $B_2O_3$, or $P_2O_5$, each between about 3 to 5 weight percent; and overlying, said second undoped silicon oxide layer, obtained via LPCVD or PECVD procedures, at a thickness between about 200 to 500 Angstroms.

18. The method of claim 12, wherein said first narrow diameter opening is formed via an anisotropic RIE procedure, with said first narrow diameter opening having a diameter between about 3000 to 3500 Angstroms, and with an aspect ratio between about 4 to 6, to 1.

19. The method of claim 12, wherein said isotropic wet etch procedure, is performed using a buffered hydrofluoric acid solution, resulting in an increase in diameter, for the opening in the doped silicon oxide component of said first narrow diameter opening, to between about 4000 to 5000 Angstroms.

20. The method of claim 12, wherein said tungsten based layer, of said tee shaped, lower metal plug structure, is comprised of an underlying titanium—titanium nitride layer, and a tungsten layer.

21. The method of claim 12, wherein said second narrow diameter opening is formed in said planarized insulator layer, via an anisotropic RIE procedure, using $CHF_3$ as an etchant, with said second narrow diameter opening having a diameter between about 2500 to 3000 Angstroms, and an aspect ratio between about 2 to 4, to 1.

* * * * *